United States Patent
Joko et al.

(10) Patent No.: US 9,433,131 B2
(45) Date of Patent: Aug. 30, 2016

(54) BOARD UNIT AND ELECTRONIC DEVICE

(71) Applicant: FUJITSU LIMITED, Kawasaki-shi, Kanagawa (JP)

(72) Inventors: Kenji Joko, Yokohama (JP); Hideaki Matsumoto, Yokohama (JP); Mitsuaki Hayashi, Kawasaki (JP); Osamu Saito, Kawasaki (JP); Takaharu Izuno, Kawasaki (JP); Minoru Fujii, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 214 days.

(21) Appl. No.: 14/153,208

(22) Filed: Jan. 13, 2014

(65) Prior Publication Data

US 2014/0268568 A1    Sep. 18, 2014

(30) Foreign Application Priority Data

Mar. 18, 2013 (JP) ................................ 2013-055350

(51) Int. Cl.
*H05K 7/20* (2006.01)
*G06F 1/20* (2006.01)

(52) U.S. Cl.
CPC ...... *H05K 7/20727* (2013.01); *H05K 7/20145* (2013.01); *H05K 7/20736* (2013.01)

(58) Field of Classification Search
CPC ..................... H05K 7/20136–7/20145; H05K 7/20554–7/20581; H05K 7/20718–7/20736
See application file for complete search history.

(56) References Cited

U.S. PATENT DOCUMENTS

| | | | | |
|---|---|---|---|---|
| 6,229,701 B1* | 5/2001 | Kung | ..................... | G06F 1/203 165/185 |
| 7,031,154 B2* | 4/2006 | Bash | .................. | H05K 7/20736 165/80.3 |
| 7,075,788 B2* | 7/2006 | Larson | ..................... | G06F 1/20 165/185 |
| 7,079,387 B2* | 7/2006 | Brooks | ..................... | G06F 1/20 165/185 |
| 7,244,178 B2* | 7/2007 | Ueda | .................. | H05K 7/20572 165/80.3 |
| 7,408,774 B1* | 8/2008 | Anderl | ............... | H05K 7/20727 174/16.1 |
| 7,518,865 B2* | 4/2009 | Anderl | ..................... | G06F 1/20 165/121 |
| 7,733,649 B2* | 6/2010 | Anderl | ............... | H05K 7/20727 174/16.1 |
| 7,940,528 B2* | 5/2011 | Wang | ..................... | G06F 1/203 165/185 |

(Continued)

FOREIGN PATENT DOCUMENTS

| | | |
|---|---|---|
| JP | 06-120386 | 4/1994 |
| JP | 2004-200344 | 7/2004 |
| JP | 2010-027649 | 2/2010 |

(Continued)

*Primary Examiner* — Robert J Hoffberg
(74) *Attorney, Agent, or Firm* — Staas & Halsey LLP

(57) ABSTRACT

A board unit includes a board to have an object to be cooled, the object being implemented on the board, a baffle plate to be rotatably coupled to the board and to be displaced to a first rotary position to guide a cooling air, flowing from a first direction to the board, to the object to be cooled and a second rotary position to guide a cooling air, flowing from a second direction to the board, to the object to be cooled, and an arm to be movably attached to the board and also to be rotatably coupled to a rotary end of the baffle plate to displace the baffle plate to the first rotary position and the second rotary position with movement.

18 Claims, 9 Drawing Sheets

(56) References Cited

U.S. PATENT DOCUMENTS

| | | | | |
|---|---|---|---|---|
| 7,946,336 | B2* | 5/2011 | Wang | H01L 23/467 165/80.2 |
| 8,120,910 | B2* | 2/2012 | Hong | H05K 7/20181 236/49.5 |
| 8,408,981 | B2* | 4/2013 | Su | F04D 29/441 165/104.34 |
| 8,840,453 | B2* | 9/2014 | Izuno | H05K 7/20727 361/679.46 |
| 2004/0196631 | A1 | 10/2004 | Ueda et al. | |
| 2012/0133255 | A1 | 5/2012 | Izuno et al. | |
| 2013/0126145 | A1* | 5/2013 | Glover | H01L 23/4093 165/185 |
| 2015/0055296 | A1* | 2/2015 | Joko | H05K 7/20145 361/695 |

FOREIGN PATENT DOCUMENTS

| | | |
|---|---|---|
| JP | 2012-083860 | 4/2012 |
| JP | 2012-114379 | 6/2012 |

* cited by examiner

BOARD UNIT AND ELECTRONIC DEVICE

CROSS-REFERENCE TO RELATED APPLICATION

This application is based upon and claims the benefit of priority of the prior Japanese Patent Application No. 2013-055350, filed on Mar. 18, 2013, the entire contents of which are incorporated herein by reference.

FIELD

The embodiments discussed herein are related to a board unit and an electronic device.

BACKGROUND

In the past, there are board units provided with a board having an object to be cooled implemented therein and a baffle plate to guide a cooling air to the object to be cooled, and electronic devices having such board unit implemented therein. Such electronic devices may include, in general, a vertical implementation type to vertically implement a board unit and a horizontal implementation type to horizontally implement a board unit.

However, there is a case that a direction that a cooling air flows is different between an electronic device of the vertical implementation type and an electronic device of the horizontal implementation type. In this case, when a board unit for vertical implementation having a baffle plate set at an angle in conformity with the vertical implementation is implemented in an electronic device of the horizontal implementation type, there is a risk that the angle of the baffle plate is not compatible. In the meanwhile, when separately preparing a board unit dedicated to vertical implementation having a baffle plate set at an angle in conformity with the vertical implementation and a board unit dedicated to horizontal implementation having a baffle plate set at an angle in conformity with horizontal implementation, the costs increase.

Examples of related art may include Japanese Laid-open Patent Publication Nos. 2010-27649, 2012-114379, 6-120386, and 2004-200344.

SUMMARY

According to an aspect of the embodiments, a board unit includes a board to have an object to be cooled the object being implemented on the board, a baffle plate to be rotatably coupled to the board and to be displaced to a first rotary position to guide a cooling air flowing from a first direction to the board to the object to be cooled and a second rotary position to guide a cooling air flowing from a second direction to the board to the object to be cooled, and an arm to be movably attached to the board and also to be rotatably coupled to a rotary end of the baffle plate to displace the baffle plate to the first rotary position and the second rotary position with movement.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Descriptions are given below to one embodiment of a technique of the present disclosure with reference to the drawings.

Figure 1:
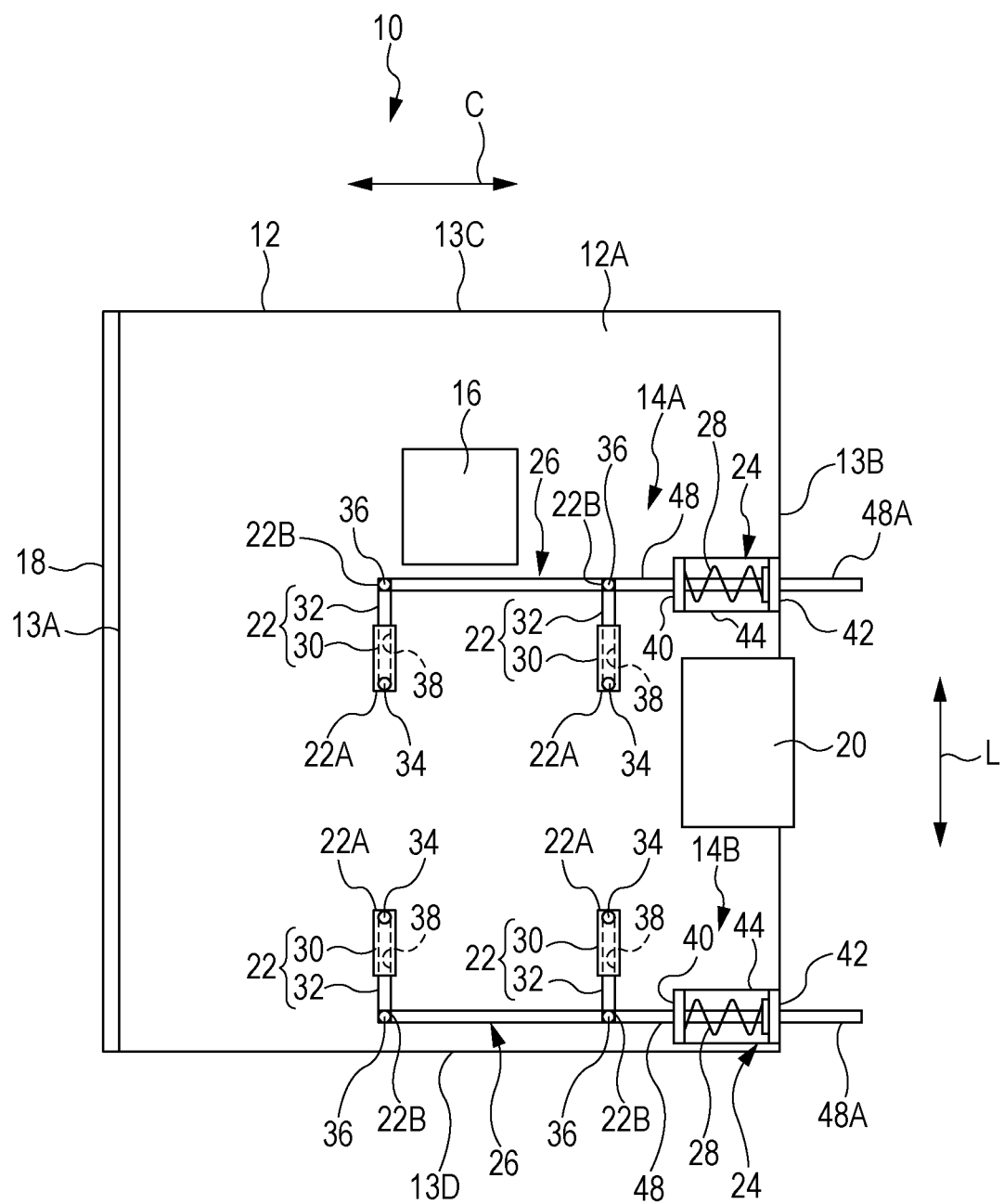
FIG. 1 is a plan view of a board unit.

As illustrated in FIG. 1, a board unit 10 according to the present embodiment is provided with a board 12 and a pair of baffle mechanisms 14A and 14B. The board 12 is formed quadrangularly in plan view. On one implementation surface 12A of the board 12, a control element 16, which is one example of an object to be cooled, other electrical components not illustrated, and the like are implemented.

To one lengthwise edge 13A of a pair of lengthwise edges 13A and 13B formed in the board 12, a front panel 18 extending along the lengthwise edge 13A is attached. The front panel 18 is arranged to put a horizontal direction of the board 12 (direction of arrow C, which is a direction that a pair of horizontal edges 13C and 13D extend) in a direction of a panel thickness. In an area on the other lengthwise edge 13B side on the one implementation surface 12A of the board 12, a connector 20 is implemented.

The pair of baffle mechanisms 14A and 14B are equipped on the one implementation surface 12A of the board 12. The pair of baffle mechanisms 14A and 14B are arranged in alignment with a lengthwise direction of the board 12 (direction of arrow L, which is a direction that the pair of lengthwise edges 13A and 13B extend). The one baffle mechanism 14A has a pair of baffle plates 22, a support member 24, an arm 26, and a spring 28 (also refer to FIG. 2).

The pair of baffle plates 22 are configured identical to each other and arranged in alignment with the horizontal direction of the board 12. The pair of baffle plates 22 are equipped adjacent to the control element 16. The pair of baffle plates 22 guides a cooling air as described later and are arranged on the other horizontal edge 13D side relative to the control element 16 and also on both horizontal direction sides of the board 12 relative to the control element 16.

Figure 2:
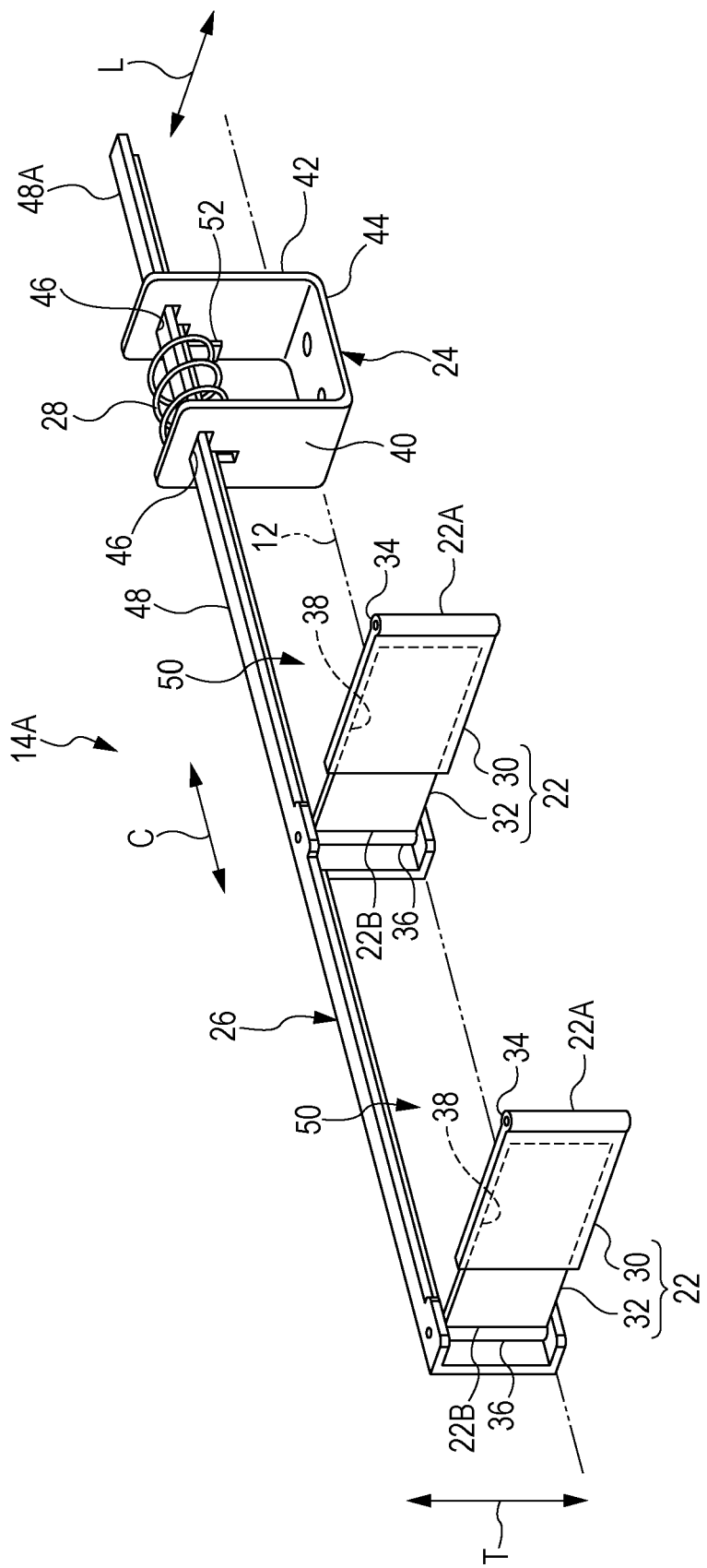
FIG. 2 is a perspective view of a baffle mechanism illustrated in FIG. 1.

Each baffle plate 22 has a rotary plate 30 and a slide plate 32. The rotary plate 30 and the slide plate 32 are formed in a flat plate shape, respectively, and arranged to cross (as one example, to be orthogonal to) the board 12. The rotary plate 30 is arranged on a base end 22A side of the baffle plate 22. The base end 22A of the rotary plate 30 (base end 22A of the baffle plate 22) is rotatably coupled to the board 12 via a rotary shaft 34 having an axial direction in the board thickness direction of the board 12. The slide plate 32 is arranged on a rotary end 22B side of the baffle plate 22. An end portion of the slide plate 32 on a side opposite to the rotary plate 30 side (the rotary end 22B of the baffle plate 22)

is rotatably coupled to the arm 26 via a rotary shaft 36 having an axial direction in the board thickness direction of the board 12 (also refer to FIG. 2).

The rotary plate 30 has a concave container portion 38 opening on the rotary end 22B side of the baffle plate 22, and the slide plate 32 is designed to be taken in and out of the container portion 38. Then, the slide plate 32 is taken in and out of the container portion 38, thereby sliding the slide plate 32 in a direction of guiding a cooling air relative to the rotary plate 30, which enables the baffle plate 22 to extend and retract in a longitudinal direction (that is, in a direction of guiding a cooling air) (also refer to FIGS. 5 and 8).

The support member 24 is arranged on the other lengthwise edge 13B side of the board 12 from the pair of baffle plates 22. The support member 24 is fixed to the one implementation surface 12A of the board 12. The support member 24 has a pair of side wall portions 40 and 42 facing the horizontal direction of the board 12 and a bottom wall portion 44 joining the pair of side wall portions 40 and 42. In the pair of side wall portions 40 and 42, as illustrated in FIG. 2, respective L-shaped through holes 46 having a shape approximately similar to an L-shaped cross section of the arm 26 described later are formed. The pair of through holes 46 are formed coaxially.

The arm 26 is formed to have an L-shaped cross section and extends linearly. The arm 26 is arranged to put the horizontal direction of the board 12 (direction of arrow C) in the longitudinal direction. The arm 26 has an extension portion 48 extending on a side opposite to the pair of baffle plates 22 side, and the extension portion 48 is loosely inserted into the pair of through holes 46 described above, respectively. A tip end portion 48A of the extension portion 48 is one example of one end of the arm and protrudes to a side opposite to the pair of baffle plates 22 side relative to the support member 24.

As described above, the arm 26 is rotatably coupled to the rotary end 22B of the pair of baffle plates 22 rotatably coupled to the board 12 and also the extension portion 48 is loosely inserted into the pair of through holes 46, thereby movably attaching the arm 26 to the board 12. A movement direction of the arm 26 is considered to be the horizontal direction of the board 12 (direction of arrow C). The arm 26 is equipped separately from the board 12 in a thickness direction of the board 12 (direction of arrow T), and this makes the arm 26 to have a gap 50 for ventilation against the board 12. Further, in the arm 26, a projection portion 52 is formed. The projection portion 52 is positioned between the pair of side wall portions 40 and 42. The projection portion 52 also extends in a direction to be orthogonal to the longitudinal direction of the arm 26.

The spring 28 is one example of an elastic member and depicted as a coil spring. The spring 28 is arranged to put the longitudinal direction of the arm 26 (the horizontal direction of the board 12) in the axial direction. Inside the spring 28, the extension portion 48 of the arm 26 is inserted. The spring 28 is inserted between the side wall portion 40 and the projection portion 52 described above, and one end of the spring 28 is locked by the side wall portion 40 and the other end of the spring 28 is locked by the projection portion 52. The side wall portion 40 is one example of a first locking portion equipped in the board, and the projection portion 52 is one example of a second locking portion equipped in the arm.

Figure 5:
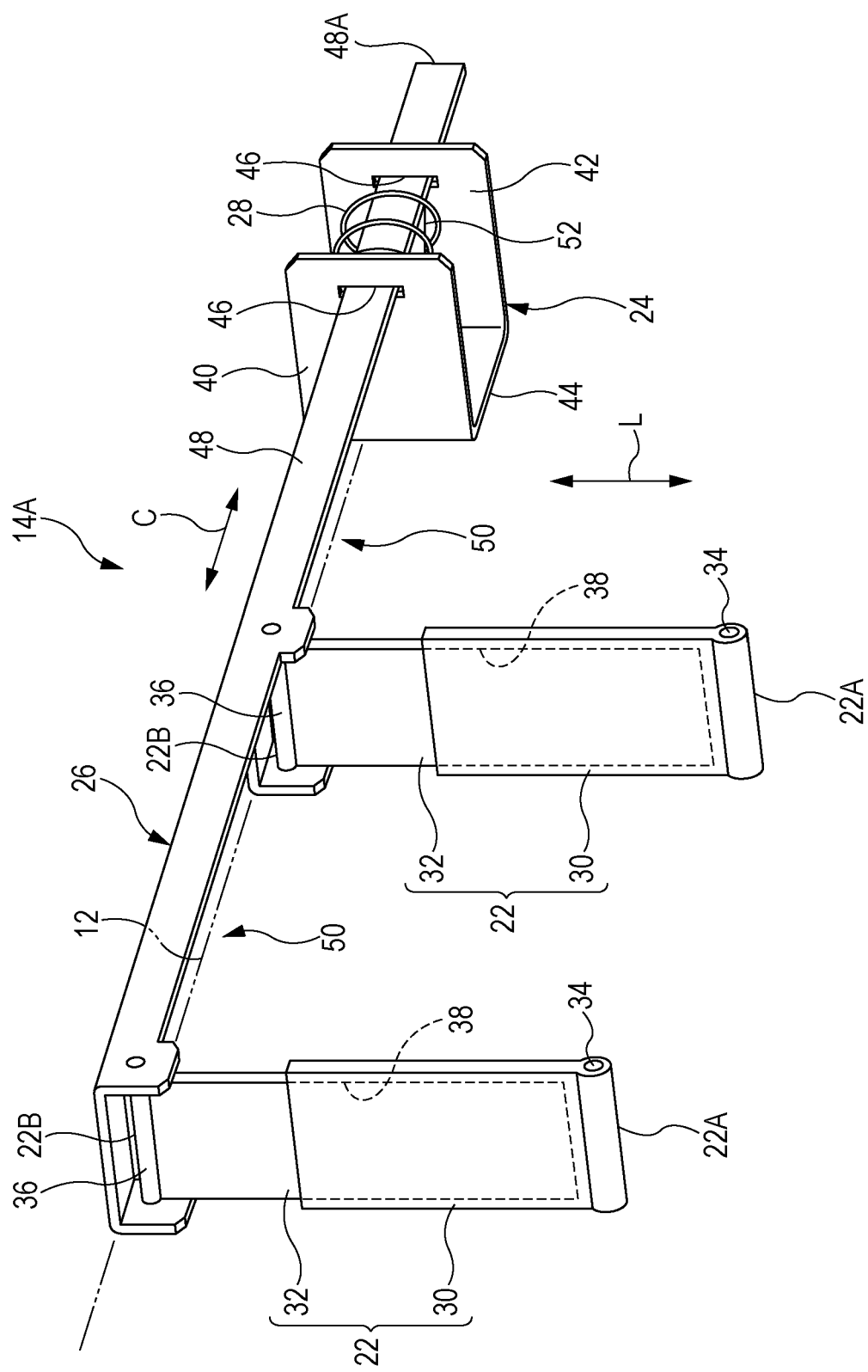
FIG. 5 is a perspective view of a baffle mechanism illustrated in FIG. 4.

Then, in the one baffle mechanism 14A, a rotary position (angle) of the pair of baffle plates 22 is displaced with movement of the arm 26 in the horizontal direction of the board 12. That is, as illustrated in FIG. 5, when the spring 28 is in a free state (non-elastic deformed state), the pair of baffle plates 22 are arranged along the lengthwise direction of the board 12 (direction of arrow L). In the following description, a rotary position of the pair of baffle plates 22 when the pair of baffle plates 22 is thus arranged along the lengthwise direction of the board 12 is referred to as a first rotary position. At this time, the slide plate 32 is pushed by the arm 26 to be inserted into the container portion 38 of the rotary plate 30. Then, this makes the baffle plates 22 to be in a contracted state.

Figure 8:
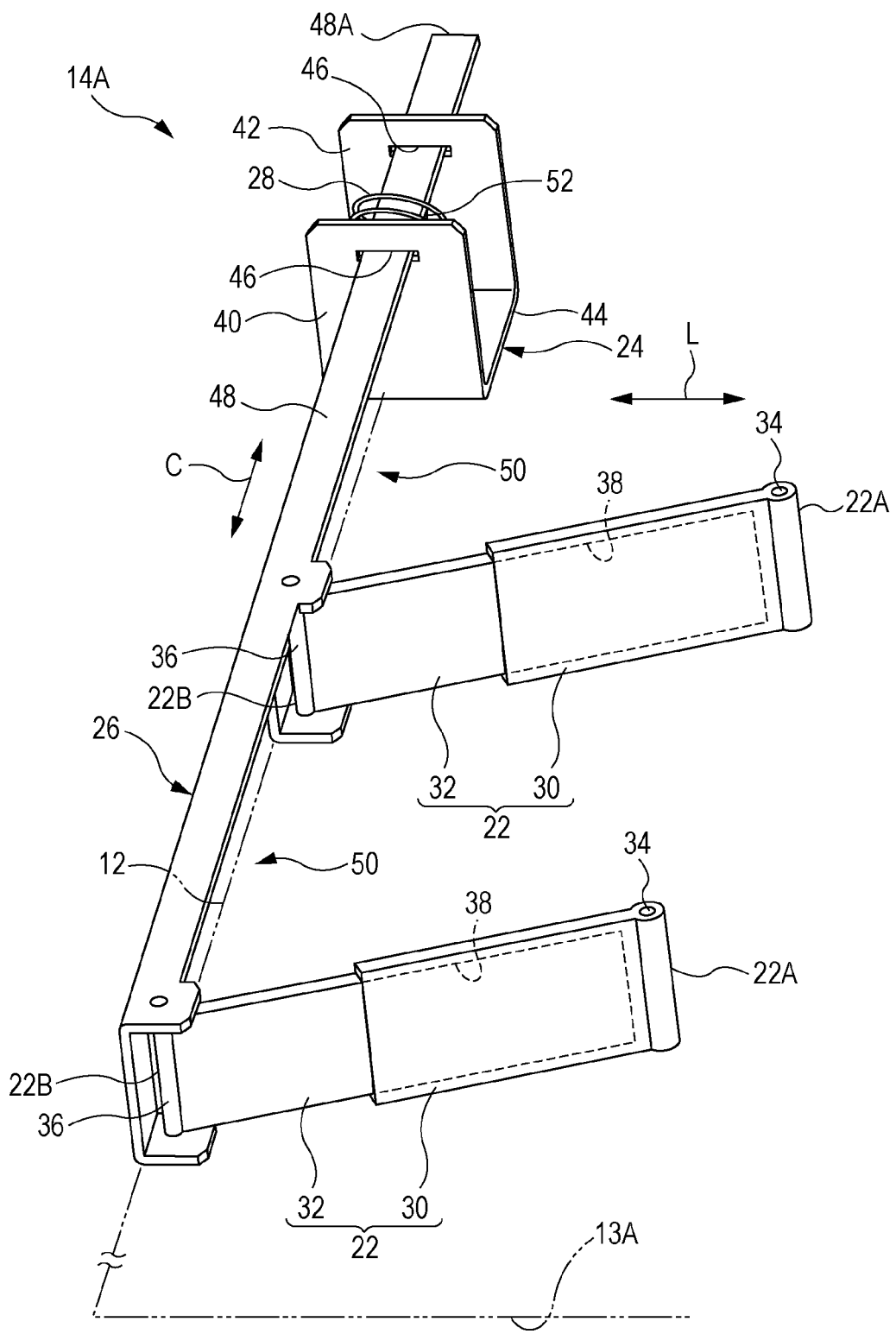
FIG. 8 is a perspective view of a baffle mechanism illustrated in FIG. 7.

In contrast, as illustrated in FIG. 8, as the arm 26 is caused to be moved to the one lengthwise edge 13A side of the board 12 against elastic force of the spring 28, the pair of baffle plates 22 are arranged obliquely relative to the lengthwise direction of the board 12 (direction of arrow L) with the movement of the arm 26. At this time, more specifically, the pair of baffle plates 22 are arranged obliquely relative to the lengthwise direction of the board 12 so as to put the rotary end 22B on the one lengthwise edge 13A side of the board 12 relative to the base end 22A. In the following description, a rotary position of the pair of baffle plates 22 when the pair of baffle plates 22 are thus arranged obliquely relative to the lengthwise direction of the board 12 to put the rotary end 22B on the one lengthwise edge 13A side of the board 12 relative to the base end 22A is referred to as a second rotary position. At this time, the slide plate 32 is pulled by the arm 26 to be pulled out of the container portion 38 of the rotary plate 30. Then, this makes the baffle plates 22 to be in an extended state.

In such a manner, in the one baffle mechanism 14A, the pair of baffle plates 22 are displaced to the first rotary position (refer to FIG. 5) and the second rotary position (refer to FIG. 8) with movement of the arm 26. An axial length of the spring 28 is set to put the pair of baffle plates 22 in the first rotary position when the spring 28 is in a free state (non-elastic deformed state) and to elastically deform the spring 28 when the pair of baffle plates 22 are in the second rotary position.

The other baffle mechanism 14B illustrated in FIG. 1 is arranged symmetrically in the lengthwise direction of the board 12 relative to the one baffle mechanism 14A described above. The other baffle mechanism 14B has, similar to the one baffle mechanism 14A described above, a pair of baffle plates 22, an arm 26, a support member 24, and a spring 28.

The pair of baffle plates 22, the arm 26, and the support member 24 in the other baffle mechanism 14B are formed symmetrically in the lengthwise direction of the board 12 (direction of arrow L) to the pair of baffle plates 22, the arm 26, and the support member 24, respectively, of the one baffle mechanism 14A described above. The pair of baffle plates 22, the arm 26, and the support member 24 in the other baffle mechanism 14B are supposed to be referred to the descriptions on the pair of baffle plates 22, the arm 26, and the support member 24 of the one baffle mechanism 14A described above to omit their descriptions. The spring 28 is, similar to the spring 28 of the one baffle mechanism 14A described above, inserted between the side wall portion 40 formed in the support member 24 and the projection portion 52 (refer to FIG. 2) formed in the arm 26.

Then, in the other baffle mechanism 14B as well, a rotary position of the pair of baffle plates 22 is displaced with movement of the arm 26 in the horizontal direction of the board 12. That is, when the spring 28 is in a free state (non-elastic deformed state), the pair of baffle plates 22 are arranged along the lengthwise direction of the board 12 (refer to FIG. 4). In the following description, a rotary position of the pair of baffle plates 22 when the pair of baffle plates 22 are thus arranged along the lengthwise direction of the board 12 is referred to as a first rotary position.

Figure 7:
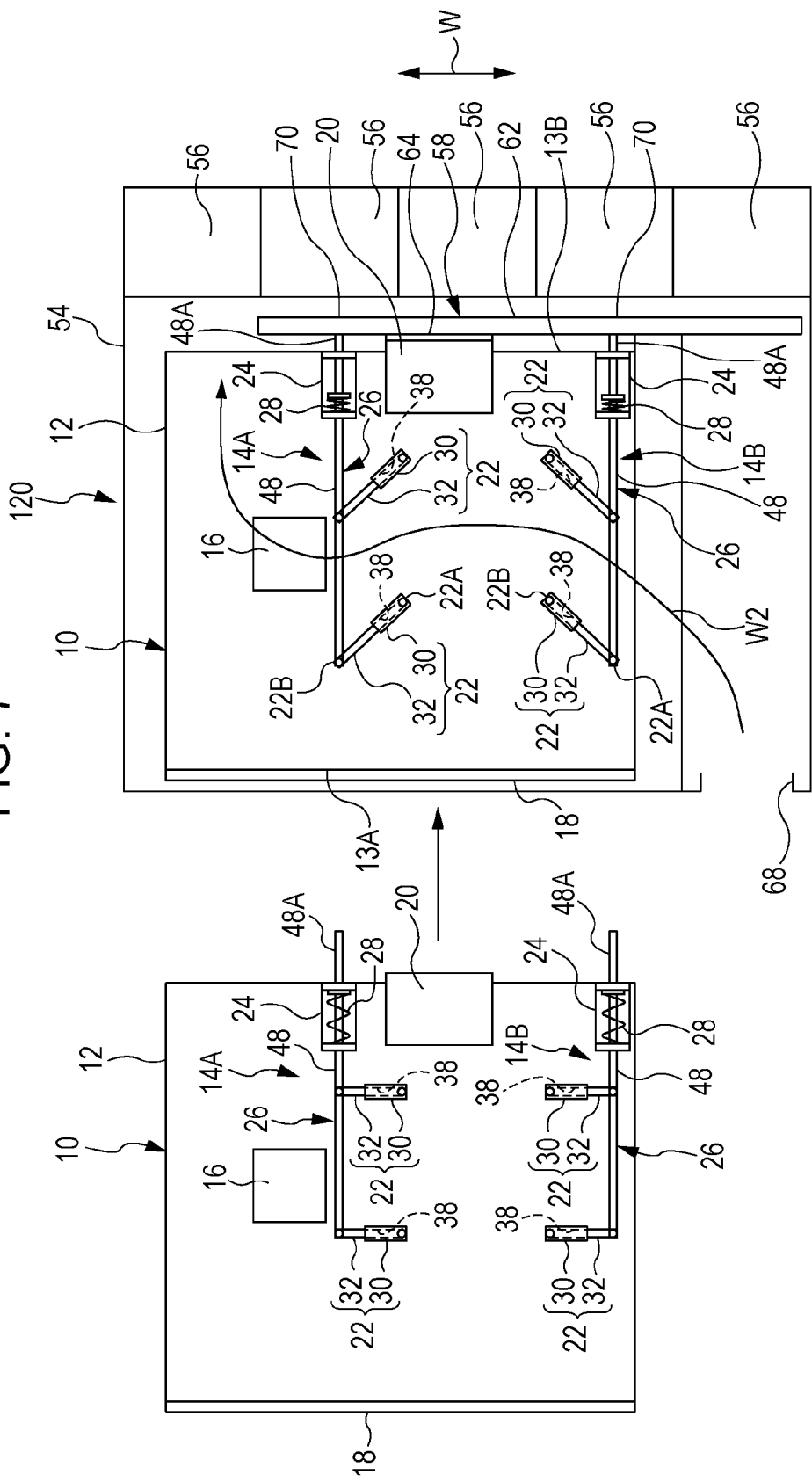
FIG. 7 is a plan cross-sectional view of the electronic device of the horizontal implementation type illustrated in FIG. 6.

In contrast, as the arm 26 is caused to be moved to the one lengthwise edge 13A side of the board 12 against elastic force of the spring 28, the pair of baffle plates 22 are arranged obliquely relative to the lengthwise direction of the board 12 with the movement of the arm 26 (refer to FIG. 7). At this time, more specifically, the pair of baffle plates 22 are arranged obliquely relative to the lengthwise direction of the board 12 so as to put the rotary end 22B on the other lengthwise edge 13B side of the board 12 relative to the base end 22A. In the following description, in the other baffle mechanism 14B, a rotary position of the pair of baffle plates 22 when the pair of baffle plates 22 are arranged obliquely relative to the lengthwise direction of the board 12 to put the rotary end 22B on the other lengthwise edge 13B side of the board 12 relative to the base end 22A is referred to as a second rotary position.

In such a manner, in the other baffle mechanism 14B as well, the pair of baffle plates 22 are displaced to the first rotary position (refer to FIG. 4) and the second rotary position (refer to FIG. 7) with movement of the arm 26. An axial length of the spring 28 is set to put the pair of baffle plates 22 in the first rotary position when the spring 28 is in a free state (non-elastic deformed state) and to elastically deform the spring 28 when the pair of baffle plates 22 are in the second rotary position.

Next, descriptions are given to an electronic device of the vertical implementation type having the board unit 10 described above implemented therein.

Figure 3:
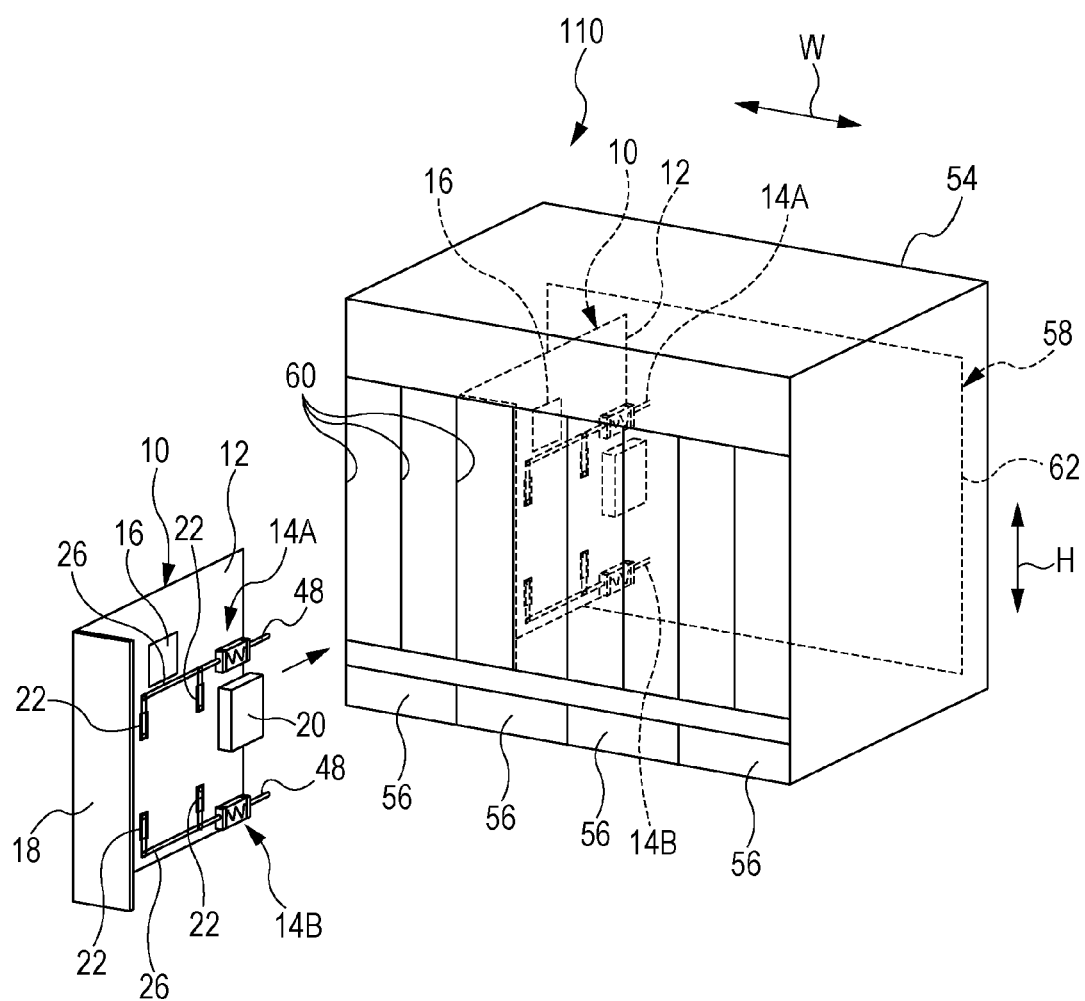
FIG. 3 is a perspective view of an electronic device of a vertical implementation type.

As illustrated in FIG. 3, an electronic device 110 of a vertical implementation type is provided with a plurality of board units 10, a housing 54, a plurality of fan units 56, and a back wiring board 58.

The housing 54 is formed in a box shape opening on a front side of the electronic device 110. In the housing 54, a plurality of slots 60 to hold the plurality of board units 10 are formed. The plurality of slots 60 are in alignment with a width direction of the electronic device 110 (direction of arrow W).

The plurality of board units 10 are held in the respective plurality of slots 60. Each board unit 10 is implemented in the electronic device 110 in such a manner that the board 12 extendingly exists in a vertical direction of the electronic device 110 (direction of arrow H, which is a height direction). Each board unit 10 is arranged in such a manner that the board thickness direction of the board 12 matches the width direction of the electronic device 110 and also the lengthwise direction of the board 12 matches the height direction of the electronic device 110.

Figure 4:
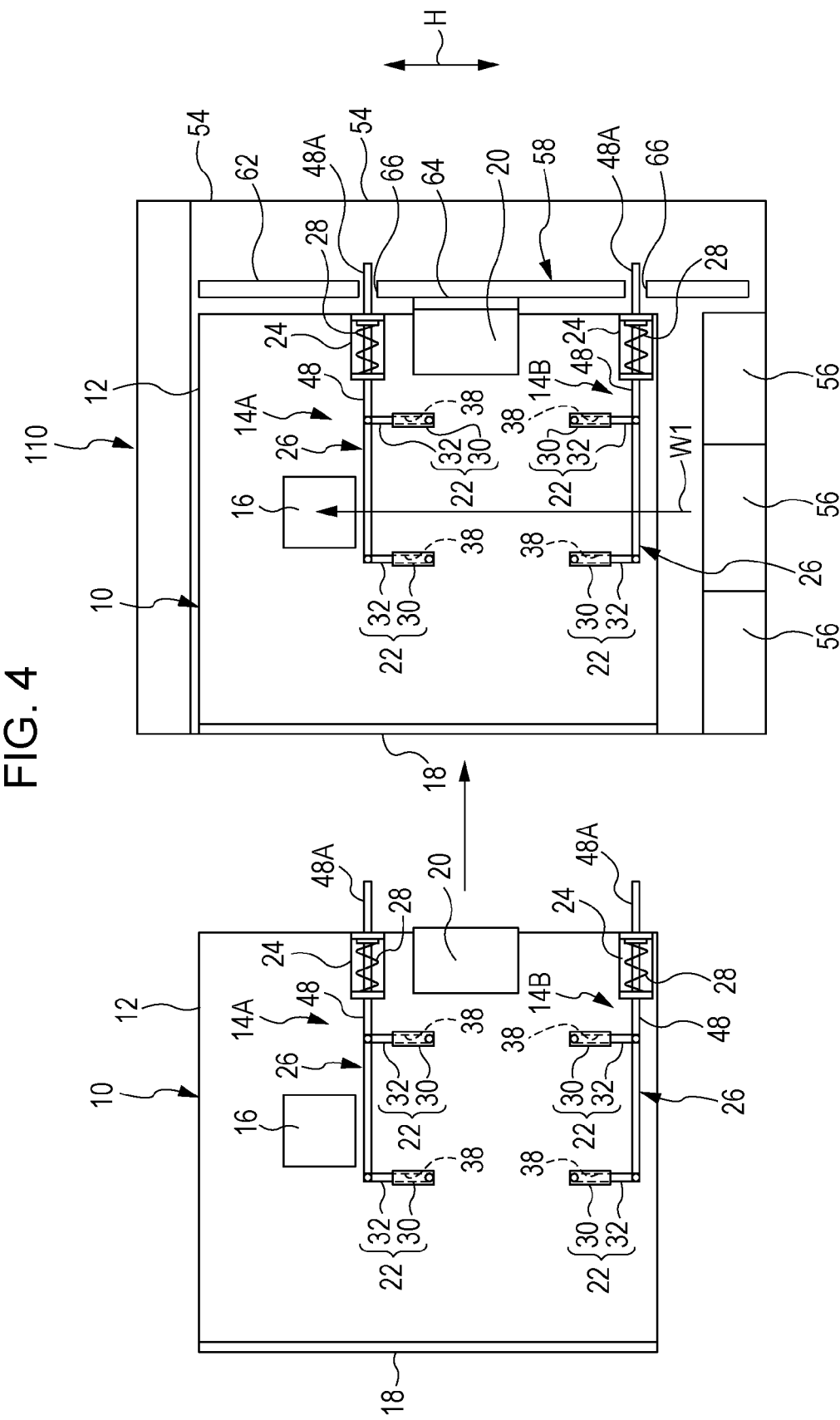
FIG. 4 is a side cross-sectional view of the electronic device of a vertical implementation type illustrated in FIG. 3.

The plurality of fan units 56 are arranged in matrix in a width direction and a depth direction of the electronic device 110. The plurality of fan units 56 are positioned on the bottom side of the electronic device 110 relative to the plurality of board units 10. Then, as illustrated in FIG. 4, each fan unit 56 forms a flow of a cooling air W1 flowing from the bottom side of (below) the electronic device 110 to the board 12. The cooling air W1 enters the board 12 along the lengthwise direction of the board 12 (height direction of the electronic device) in a side cross-sectional view of the electronic device 110. The cooling air W1 is one example of a cooling air flowing from a first direction to the board.

The back wiring board 58 is equipped on a rear side of the electronic device 110 from the plurality of board units 10 and is held in the housing 54. The back wiring board 58 has a board main body 62 and a connector 64. The board main body 62 is arranged to put the depth direction of the electronic device 110 in the board thickness direction. The connector 64 is equipped in a position corresponding to the connector 20 of the board unit 10 described above. The connector 64 is connected with the connector 20 of the board unit 10 when the board unit 10 is implemented in the electronic device 110.

In the board main body 62 of the back wiring board 58, cut-off portions 66 in positions corresponding to the extension portions 48 of the arms 26 equipped in the pair of baffle mechanisms 14A and 14B described above are formed, respectively. Each cut-off portion 66 is one example of a defining portion to define a position of the arm 26, and is formed by a through hole to penetrate in the board thickness direction of the board main body 62. Each cut-off portion 66 is formed in a size and a shape that allow insertion of the tip end portion 48A of the extension portion 48.

Then, in the electronic device 110 of the vertical implementation type, as the board unit 10 is implemented in the electronic device 110, the tip end portions 48A in the extension portions 48 of the arms 26 equipped in the pair of baffle mechanisms 14A and 14B are inserted into the cut-off portions 66, respectively. In the one baffle mechanism 14A, as the tip end portion 48A of the extension portion 48 is inserted into the cut-off portion 66, the spring 28 is maintained in a free state and the pair of baffle plates 22 are arranged along the lengthwise direction of the board 12 (that is, positioned in the first rotary position). At this time, each slide plate 32 is pushed by the arm 26, and each slide plate 32 is inserted into the container portion 38 of the rotary plate 30, respectively. Then, this makes each baffle plate 22 to be in a contracted state in a direction of guiding the cooling air W1.

Similarly, in the other baffle mechanism 14B as well, as the tip end portion 48A of the extension portion 48 is inserted into the cut-off portion 66, the spring 28 is maintained in a free state and the pair of baffle plates 22 are arranged along the lengthwise direction of the board 12 (that is, positioned in the first rotary position). At this time, each slide plate 32 is pushed by the arm 26, and each slide plate 32 is inserted into the container portion 38 of the rotary plate 30, respectively. Then, this makes each baffle plate 22 to be in a contracted state in a direction of guiding the cooling air W1.

In such a manner, in the electronic device 110 of the vertical implementation type, as the board unit 10 is implemented in the electronic device 110, a position of the arm 26 is defined by the cut-off portion 66, and the pair of baffle plates 22 equipped in the pair of baffle mechanisms 14A and 14B are maintained in the first rotary position, respectively.

As the plurality of fan units 56 are actuated in a state where the board unit 10 is implemented in the electronic device 110 of the vertical implementation type, a flow of the cooling air W1 flowing from the bottom side of (below) the electronic device 110 to the board 12 is formed. Then, when each baffle plate 22 is positioned in the first rotary position as described above, the cooling air W1 is guided to the control element 16 by each baffle plate 22 to cool the control element 16. At this time, more specifically, the cooling air W1 flows along the lengthwise direction of the board 12 (height direction of the electronic device 110) and also passes through between the pair of baffle plates 22 in the other baffle mechanism 14B and between the pair of baffle plates 22 in the one baffle mechanism 14A to arrive at the control element 16.

Next, descriptions are given to an electronic device of the horizontal implementation type having the board unit 10 described above implemented therein.

Figure 6:
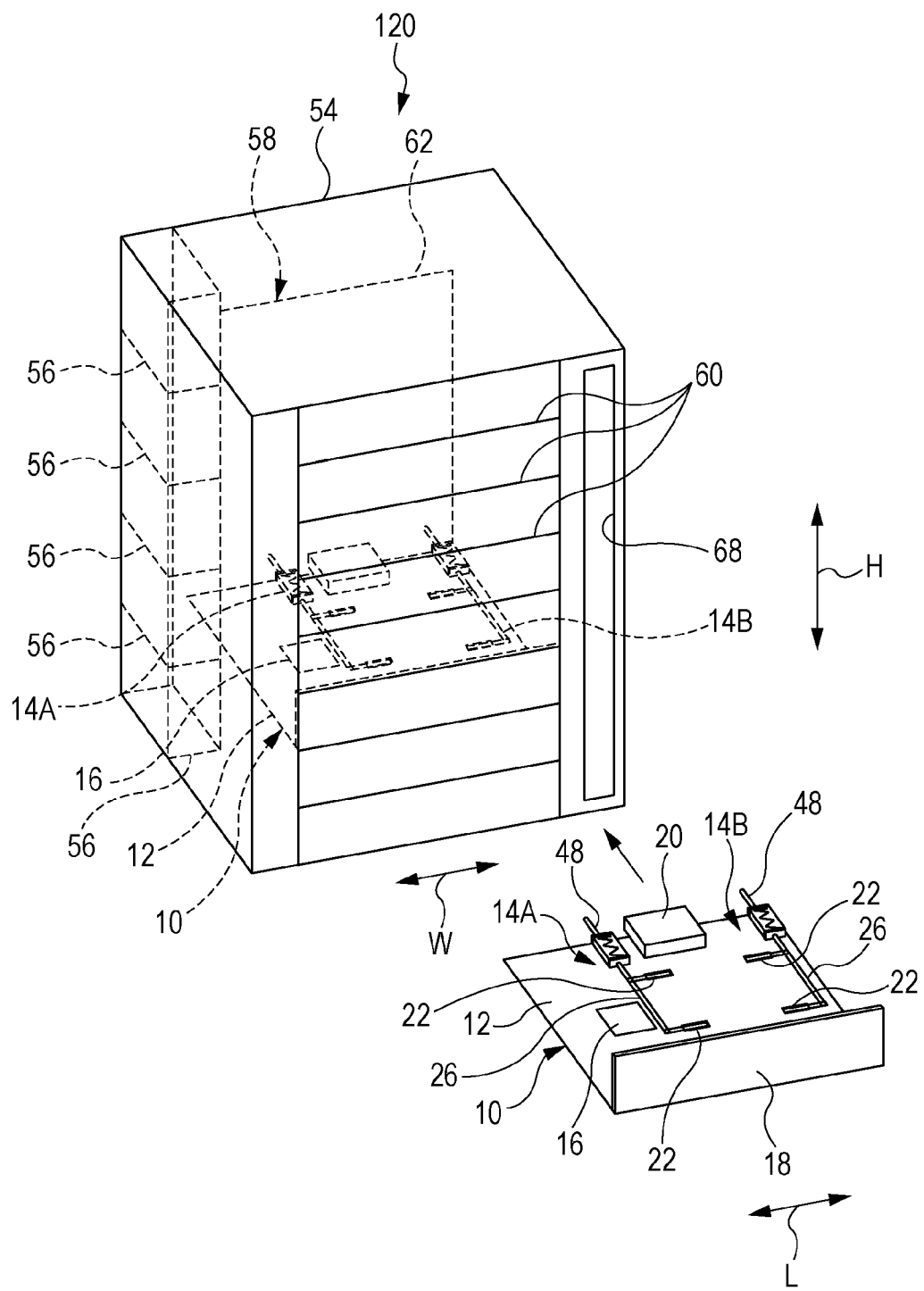
FIG. 6 is a perspective view of an electronic device of a horizontal implementation type.

An electronic device 120 of the horizontal implementation type illustrated in FIG. 6 is, similar to the electronic device 110 of a vertical implementation type described above (refer to FIG. 3), provided with a plurality of board units 10, a housing 54, a plurality of fan units 56, and a back wiring board 58. The electronic device 120 of the horizontal implementation type has a structure modified as follows from the electronic device 110 of the vertical implementation type described above.

That is, the plurality of slots 60 formed in the housing 54 are in alignment with a height direction of the electronic device 120 (direction of arrow H). Each board unit 10 is implemented in the electronic device 120 in such a manner that the board 12 extendingly exists in a horizontal direction (the width direction and the depth direction) of the electronic device. Each board unit 10 is arranged in such a manner that the lengthwise direction of the board 12 (direction of arrow L) matches the width direction of the electronic device 120 (direction of arrow W).

The plurality of fan units 56 are arranged in alignment with the height direction of the electronic device 120. The plurality of fan units 56 are arranged at the left rear corner inside the housing 54. In the meanwhile, at the right front corner of the housing 54, an air inlet 68 is formed. The air inlet 68 extends along the height direction of the electronic device. Then, as illustrated in FIG. 7, each fan unit 56 forms a flow of a cooling air W2 introduced from the air inlet 68 and flowing from right front of the electronic device to the board 12. The cooling air W2 enters the board 12 along an oblique direction relative to the lengthwise direction of the board 12 (width direction of the electronic device) in a plan cross-sectional view of the electronic device 120. The cooling air W2 is one example of a cooling air flowing from a second direction relative to the board.

The back wiring board 58 is equipped in a rear side of the electronic device 120 from the plurality of board units 10 and held in the housing 54. A board main body 62 of the back wiring board 58 is arranged to put the depth direction of the electronic device 120 in the board thickness direction. The connector 64 is connected with the connector 20 of the board unit 10 when the board unit 10 is implemented in the electronic device 120.

An area of the back wiring board 58 lying on an extended line of the extension portion 48 of each arm 26 of the board main body 62 is formed as a receiving portion 70, respectively. Each receiving portion 70 is one example of the defining portion to define a position of the arm.

Then, in the electronic device 120 of the horizontal implementation type, as the board unit 10 is implemented in the electronic device 120, the tip end portions 48A in the extension portions 48 of the arms 26 equipped in the pair of baffle mechanisms 14A and 14B abut on the receiving portions 70, respectively. In the one baffle mechanism 14A, as the tip end portion 48A of the extension portion 48 abuts on the receiving portion 70, the arm 26 is moved to on the one lengthwise edge 13A side of the board 12 (front side of the electronic device) against elastic force of the spring 28 to rotate the pair of baffle plates 22. That is, in the one baffle mechanism 14A, the pair of baffle plates 22 are arranged obliquely relative to the lengthwise direction of the board 12 to put the rotary end 22B on the one lengthwise edge 13A side of the board 12 relative to the base end 22A (that is, positioned in the second rotary position). At this time, the slide plate 32 is pulled by the arm 26 to be pulled out of the container portion 38 of the rotary plate 30. Then, this makes the baffle plates 22 to be in an extended state in a direction of guiding the cooling air W2.

Similarly, in the other baffle mechanism 14B as well, as the tip end portion 48A of the extension portion 48 abuts on the receiving portion 70, the arm 26 is moved to the one lengthwise edge 13A side of the board 12 (front side of the electronic device 120) against elastic force of the spring 28 to rotate the pair of baffle plates 22. That is, in the other baffle mechanism 14B, the pair of baffle plates 22 are arranged obliquely relative to the lengthwise direction of the board 12 to put the rotary end 22B on the other lengthwise edge 13B side of the board 12 relative to the base end 22A (that is, positioned in the second rotary position). At this time, the slide plate 32 is pulled by the arm 26 to be pulled out of the container portion 38 of the rotary plate 30. Then, this makes the baffle plates 22 to be in an extended state in a direction of guiding the cooling air W2.

In such a manner, in the electronic device 120 of the horizontal implementation type, as the board unit 10 is implemented in the electronic device 120, a position of the arm 26 is defined by the receiving portion 70, and the pair of baffle plates 22 equipped in the pair of baffle mechanisms 14A and 14B are displaced to the second rotary position, respectively.

As the plurality of fan units 56 are actuated in a state where the board unit 10 is implemented in the electronic device 120 of the horizontal implementation type, a flow of the cooling air W2 introduced from the air inlet 68 and flowing from right front of the electronic device 120 relative to the board 12 is formed. Then, when each baffle plate 22 is positioned in the second rotary position as described above, the cooling air W2 is guided to the control element 16 by each baffle plate 22 to cool the control element 16.

At this time, more specifically, the cooling air W2 flows in the following manner. That is, the cooling air W2 introduced from the air inlet 68 and flowing from right front of the electronic device 120 to the board 12 has an orientation of the flow modified to the width direction of the electronic device 120 by the pair of baffle plates 22 in the other baffle mechanism 14B. The cooling air W2 having passed through between the pair of baffle plates 22 in the other baffle mechanism 14B has an orientation of the flow modified to left front of the electronic device 120 by the pair of baffle plates 22 in the one baffle mechanism 14A to arrive at the control element 16. Then, the cooling air W2 thus having cooled the control element 16 has an orientation of the flow modified to the rear side of the electronic device 120 to be sucked into the plurality of fan units 56.

Next, descriptions are given to actions and effects of the present embodiment.

As described in detail above, a direction of a flow of the cooling air relative to the board 12 (direction of the cooling air entering the board 12) is different between the electronic device 110 of a vertical implementation type and the electronic device 120 of the horizontal implementation type. However, according to the board unit 10 according to the present embodiment, even in a case that the direction of the flow of the cooling air is different, it is possible to modify the rotary position (angle) of each baffle plate 22 corresponding to the direction of the flow of the cooling air. This enables to use the board unit 10 in common between the electronic device 110 of the vertical implementation type and the electronic device 120 of the horizontal implementation type. As a result, it is possible to reduce costs compared with a case of separately preparing the board unit for vertical implementation and the board unit for horizontal implementation.

In the electronic device 110 of the vertical implementation type, the cut-off portions 66 in a hole shape are formed in the board main body 62 of the back wiring board 58, and the tip end portions 48A of the extension portions 48 formed in the arms 26 are inserted into the cut-off portions 66. Then, this makes the positions of the arms 26 defined to position each baffle plate 22 in the first rotary position. In contrast, in the electronic device 120 of the horizontal implementation type, a part of the board main body 62 of the back wiring board 58 is formed as the receiving portions 70, and the tip end portions 48A of the extension portions 48 abut on the receiving portion 70. Then, this makes the position of the arms 26 to be defined and each baffle plate 22 is positioned in the second rotary position. Accordingly, it is possible to define the positions of the arms 26 at the time of implementation of the board unit 10 and also to modify the angle of each baffle plate 22 in accordance with the defined position of the arm 26, so that it is possible to improve the usability.

In the electronic device 110 of the vertical implementation type, the structures to define the positions of the arms 26 are considered to be the cut-off portions 66 in a hole shape which are formed in the board main body 62 of the back wiring board 58. In contrast, in the electronic device 120 of the horizontal implementation type, the structures to define the positions of the arm 26 are considered to be the receiving portions 70 formed in a part of the board main body 62 of the back wiring board 58. Accordingly, since the structures to define the positions of the arms 26 are simple, this also enables to attempt to reduce costs.

The baffle plates 22 extend and retract in a direction of guiding the cooling air. Accordingly, it is possible to rotate the baffle plates 22 with the movement of the arms 26.

Since the spring 28 is in a free state when no external force is applied to the arm 26, it is possible to put each baffle plate 22 in the first rotary position, which is an initial position.

Each baffle plate 22 has the rotary plate 30 rotatably coupled to the board 12 and the slide plate 32 rotatably coupled to the arm 26 and also to slide in a direction of guiding a cooling air relative to the rotary plate 30. Accordingly, it is possible to extend and retract the baffle plates 22 in a direction of guiding a cooling air with a simple configuration.

The rotary plate 30 and the slide plate 32 are formed in a flat plate shape. Accordingly, it is possible to reduce the resistance against the cooling air, so that it is possible to smoothly guide the cooling air. This enables to improve the cooling efficiency by a cooling air.

The rotary plate 30 has the concave container portion 38 opening on the rotary end 22B side of each baffle plate 22, and the slide plate 32 is taken in and out of the container portion 38. Accordingly, compared with a case of contracting the baffle plates 22 so as to overlap the rotary plate 30 and the slide plate 32, for example, it is possible to lower the level difference between the rotary plate 30 and the slide plate 32. This enables to guide the cooling air by the baffle plates 22.

Moreover, even when extending and retracting the baffle plates 22 by sliding the slide plates 32 relative to the rotary plates 30, the position of the level difference between the rotary plate 30 and the slide plate 32 in a direction of guiding a cooling air (that is, an opening edge portion of the container portion 38) does not change. Accordingly, this also enables to stably guide a cooling air by the baffle plates 22.

Since the arm 26 has the gap 50 for ventilation against the board 12, it is possible to pass a cooling air through the gap 50. This enables to improve the cooling efficiency relative to the board 12.

Next, descriptions are given to a modification of the present embodiment.

While the control element 16 implemented in the board 12 is considered to be an object to be cooled in the embodiment described above, other members, such as a heat sink, for example, may also be considered as the object to be cooled.

As illustrated in FIG. 4, the cooling air W1 as one example of the first direction relative to the board flows from the bottom side of (below) the electronic device to the board 12. However, the cooling air W1 may also flow from a direction other than the bottom side of the electronic device relative to the board 12.

Similarly, as illustrated in FIG. 7, the cooling air W2 is introduced from the air inlet 68 as one example of the second direction relative to the board and also flows from right front of the electronic device 120 to the board 12. However, the cooling air W2 may also flow from a direction other than right front of the electronic device 120 to the board 12. The cooling air W1 and W2 may also flow from any direction to the board 12 as one example of the first direction and the second direction.

In a case that the board unit 10 is implemented in the electronic device 110 of a vertical implementation type, each baffle plate 22 is arranged along the lengthwise direction of the board 12 as one example of the first rotary position. However, in a case that the board unit 10 is implemented in the electronic device 110 of the vertical implementation type, each baffle plate 22 may also be arranged obliquely relative to the lengthwise direction of the board 12 as one example of the first rotary position.

In a case that the board unit 10 is implemented in the electronic device 120 of the horizontal implementation type, each baffle plate 22 is arranged obliquely relative to the lengthwise direction of the board 12 as one example of the second rotary position. However, in a case that the board unit 10 is implemented in the electronic device 120 of the horizontal implementation type, each baffle plate 22 may also be arranged along the lengthwise direction of the board 12 as one example of the second rotary position. Each baffle plate 22 may also be arranged along any direction as one example of the first rotary position and the second rotary position.

The arm 26 is movably attached to the board 12 in the horizontal direction of the board 12. However, the arm 26 may also be movably attached to the board 12 in any direction of the board 12.

The arm 26 is rotatably coupled to the rotary end 22B of the baffle plate 22 (end portion on a downstream side in a direction of guiding a cooling air in the baffle plate 22). However, in the rotary end 22B of the baffle plate 22, an extension portion extending on a downstream side in a direction of guiding a cooling air from a portion coupling with the arm 26 may also be formed.

The baffle plate 22 is configured to extend and retract in a direction of guiding a cooling air. However, for example, a long hole extending in the longitudinal direction of the baffle plate 22 (direction of guiding a cooling air) may also be formed in one of the baffle plates 22 and the arms 26 and also a pin movably engaged with the long hole may also be formed in the other baffle plate 22 and arm 26. Then, the pin may also move in the long hole, thereby rotating the baffle plates 22 with the movement of the arm 26.

While the board unit 10 has the coil spring as one example of the elastic member, other elastic members may also be used instead of the spring 28.

While the side wall portion 40 of the support member 24 equipped in the board 12 is used as one example of the first locking portion to which one end of the spring 28 is locked, other locking portions equipped in the board 12 may also be used as one example of the first locking portion. While the projection portion 52 formed in the arm 26 is used as one example of the second locking portion to which the other end of the spring 28 is locked, other locking portions equipped in the board 12 may also be used as one example of the second locking portion.

In the board unit 10, the axial length of the spring 28 is set in such a manner that the spring 28 is in a free state when each baffle plate 22 is in the first rotary position. However, the axial length of the spring 28 may also be set in such a manner that the spring 28 is elastically deformed when each baffle plate 22 is in the first rotary position. In this case, the rotary position when the spring 28 is in a free state may also be the second rotary position of each baffle plate 22.

The spring 28 may also be omitted from the board unit 10. Then, without using an elastic member, such as the spring 28, the initial position (position when no external force is applied to the arm 26) of the arm 26 may also be defined by, for example, a holding portion and the like.

The baffle plate 22 has the rotary plate 30 and the slide plate 32. However, the baffle plate 22 may also be extended and retracted in a direction of guiding a cooling air by, for example, being formed in an accordion shape, being formed with a material capable of extension and retraction, and the like.

The container portion 38 is formed in the rotary plate 30 and also the slide plate 32 is held in the container portion 38, thereby contracting the baffle plates 22 in a direction of guiding a cooling air. However, the baffle plates 22 may also be contracted in a direction of guiding a cooling air by overlapping the rotary plate 30 and the slide plate 32 in the thickness direction.

In the electronic device 110 of the vertical implementation type, the cut-off portions 66 are formed by the through holes 46 formed in the board main body 62 of the back wiring board 58. However, the cut-off portions 66 may also be formed by, for example, a concave portion formed in the board main body 62 of the back wiring board 58.

In a case of forming the cut-off portions 66 by a concave portion, the defined position of the arm 26 and therefore the first rotary position of the baffle plate 22 may also be adjusted by, for example, modifying the depth of the bottom of the cut-off portions 66 as one example of modifying the shape of the cut-off portions 66. The depth of the bottom of the cut-off portions 66 may also be adjusted by, for example, inserting a spacer, which is a member separated from the board main body 62, into inside the cut-off portions 66. The defined position of the arm 26 may also be adjusted by modifying the positions of the cut-off portions 66, which is a concave portion, and also the board main body 62.

Further, in the electronic device 110 of the vertical implementation type, the length of the arm 26 (length of the extension portion 48) may also be modified, thereby adjusting the defined position of the arm 26. The defined position of the arm 26 may also be adjusted by modifying at least any of the length of the arm 26, the shape of the cut-off portions 66 to be concave portions, and the positions of the cut-off portions 66 to be concave portions.

In the electronic device 120 of the horizontal implementation type, the receiving portion 70 is formed with a part of the board main body 62 of the back wiring board 58. However, the receiving portion 70 may also be formed with, for example, a member separate from the board main body 62 of the back wiring board 58.

In a case that the receiving portion 70 is formed in a member separate from the board main body 62, the defined position of the arm 26 and therefore the second rotary position in the baffle plates 22 may also be adjusted by modifying the shape or the position of the receiving portion 70. The defined position of the arm 26 may also be adjusted by modifying the positions of the board main body 62 and also the receiving portion 70.

Further, in the electronic device 120 of the horizontal implementation type, the length of the arm 26 (length of the extension portion 48) may also be modified, thereby adjusting the defined position of the arm 26. At least any of the length of the arm 26, the shape of the receiving portion 70, and the position of the receiving portion 70 may also be modified, thereby adjusting the defined position of the arm 26.

While the board unit 10 has the pair of baffle mechanisms 14A and 14B, the number of the baffle mechanisms in the board unit 10 may also be otherwise.

Figure 9:
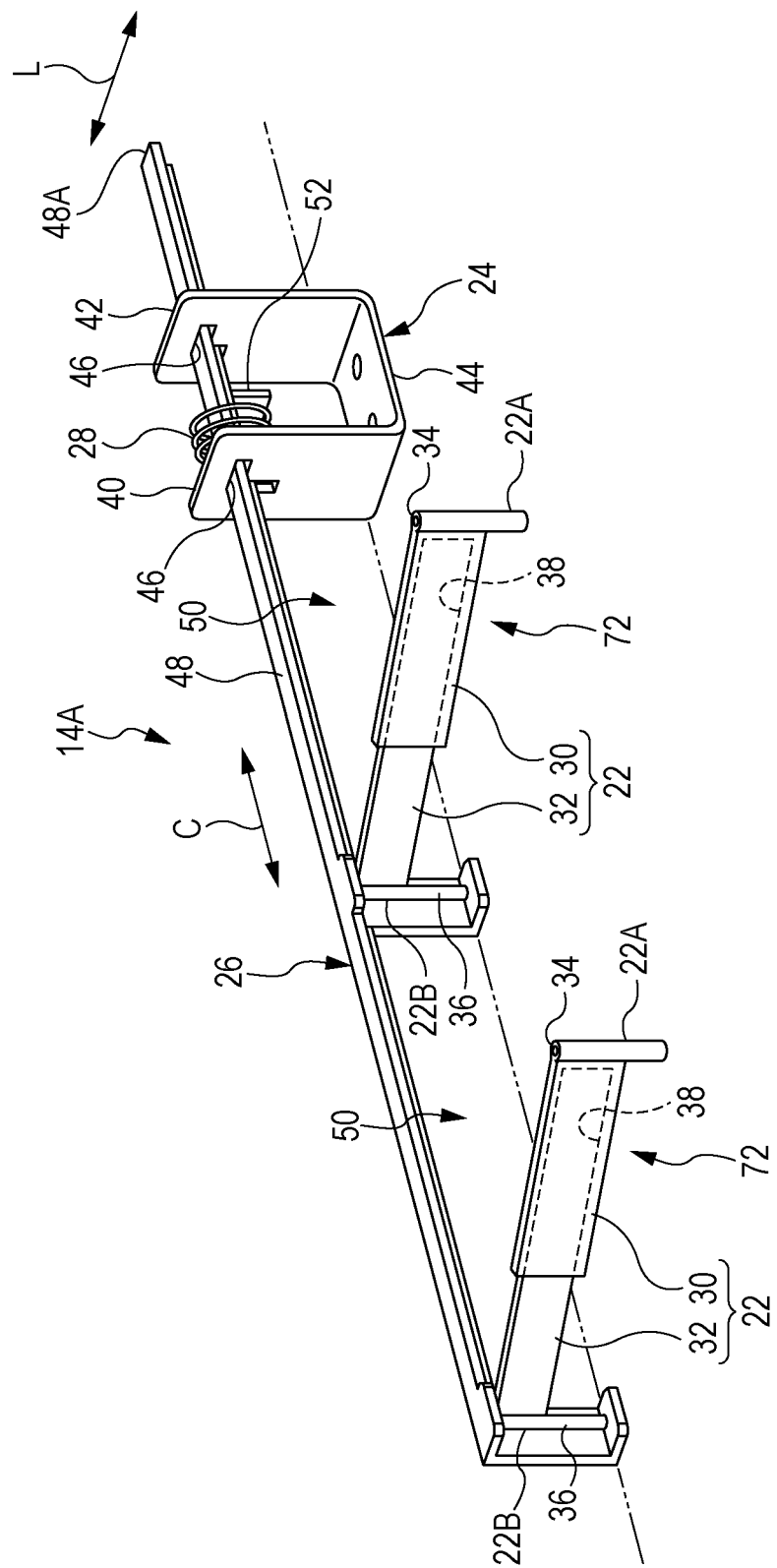
FIG. 9 is a perspective view of a modification of a baffle mechanism.

As illustrated in FIG. 9, each baffle plate 22 may also be separated from the board 12 in the board thickness direction of the board 12 and have a gap 72 for component implementation against the board 12. As thus configured, it is possible to implement a component in the board 12 utilizing the gap 72 between the baffle plates 22 and the board 12. This enables to improve component implementation efficiency in the board 12.

The plurality of modifications described above may also be performed in combination appropriately.

Although descriptions are given to embodiments of the technique of the present disclosure, the technique of the present disclosure is not limited to the above and it is naturally capable of a variety of deformation without departing from the spirit other than the above.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A board unit comprising:
   a board to have an object to be cooled, the object being implemented on the board, the board configured to be capable of being oriented in first and second orientations;
   a baffle plate rotatably coupled to the board and to be displaced to a first rotary position when the board is in the first orientation, to guide a first cooling air, to flow in a first direction with respect to the board, to the object to be cooled and a second rotary position when the board is in the second orientation, to guide a second cooling air, to flow in a second direction with respect to the board, to the object to be cooled; and
   an arm to be movably attached to the board and also to be rotatably coupled to a rotary end of the baffle plate to displace the baffle plate to the first rotary position and the second rotary position with movement of the arm.

2. The board unit according to claim 1, wherein the baffle plate extends or retracts in a direction of guiding the second cooling air or the first cooling air, respectively.

3. The board unit according to claim 1, further comprising:
an elastic member to be locked by a first locking portion that is equipped in the board and a second locking portion that is equipped in the arm, to be in a free state when the baffle plate is in one of the first rotary position and the second rotary position, and to be elastically deformed when the baffle plate is in another of the first rotary position and the second rotary position.

4. The board unit according to claim 1, wherein the baffle plate has a rotary plate that is rotatably coupled to the board, and a slide plate that is rotatably coupled to the arm and also slides in a direction of guiding the first cooling air or the second cooling air to the rotary plate.

5. The board unit according to claim 4, wherein
the rotary plate has a concave container portion opening on a rotary end side of the baffle plate, and
the slide plate is taken in and out of the concave container portion.

6. The board unit according to claim 1, wherein the baffle plate has a gap for component implementation against the board.

7. The board unit according to claim 1, wherein the arm has a gap for ventilation against the board.

8. The board unit according to claim 1, wherein the baffle plate is arranged along a lengthwise direction of the board when the baffle plate is in the first rotary position.

9. The board unit according to claim 1, wherein the baffle plate is arranged obliquely relative to a lengthwise direction of the board when the baffle plate is in the second rotary position.

10. An electronic device comprising:
the board unit according to claim 1;
a fan unit to form a flow of the first cooling air from the first direction; and
a defining portion to define a position of the arm so as to position the baffle plate in the first rotary position.

11. The electronic device according to claim 10, wherein the defining portion is a cut-off portion to insert one end of the arm therein.

12. The electronic device according to claim 10, wherein the board unit is implemented in the electronic device to put the board to extendingly exist in the first orientation of the electronic device, the first orientation being a vertical orientation.

13. The electronic device according to claim 10, wherein
the board unit is arranged to put a lengthwise direction of the board matching a height direction of the electronic device, and
the fan unit forms the flow of the first cooling air flowing from below the electronic device as the first direction.

14. The electronic device according to claim 10, wherein a defined position of the arm is adjustable by modifying at least one of a length of the arm, a shape of the defining portion, or a position of the defining portion.

15. An electronic device comprising:
the board unit according to claim 1;
a fan unit to form a flow of the second cooling air from the second direction; and
a defining portion to define a position of the arm so as to put the baffle plate positioned in the second rotary position.

16. The electronic device according to claim 15, wherein the defining portion is a receiving portion to abut on one end of the arm.

17. The electronic device according to claim 15, wherein the board unit is implemented in the electronic device to put the board to extendingly exist in the second orientation of the electronic device, the second orientation being a horizontal orientation.

18. The electronic device according to claim 15, further comprising:
a housing to hold the board; wherein
the board unit is arranged to put a lengthwise direction of the board to match a width direction of the electronic device,
the housing has a right front corner formed with an air inlet, and
the fan unit is arranged at a left rear corner inside the housing and also forms the flow of the second cooling air flowing from a right front of the electronic device introduced from the air inlet as the second cooling air from the second direction.

* * * * *